United States Patent
Caneau et al.

(10) Patent No.: US 10,811,845 B2
(45) Date of Patent: Oct. 20, 2020

(54) SURFACE EMITTING MULTIWAVELENGTH DISTRIBUTED-FEEDBACK CONCENTRIC RING LASERS

(71) Applicant: Thorlabs Quantum Electronics, Inc., Jessup, MD (US)

(72) Inventors: Catherine Genevieve Caneau, Corning, NY (US); Feng Xie, Painted Post, NY (US); Chung-En Zah, Holmdel, NJ (US)

(73) Assignee: Thorlabs Quantum Electronics, Inc., Jessup, MD (US)

( * ) Notice: Subject to any disclaimer, the term of this patent is extended or adjusted under 35 U.S.C. 154(b) by 585 days.

(21) Appl. No.: 13/772,694

(22) Filed: Feb. 21, 2013

(65) Prior Publication Data

US 2013/0221223 A1     Aug. 29, 2013

Related U.S. Application Data

(60) Provisional application No. 61/604,170, filed on Feb. 28, 2012.

(51) Int. Cl.
    *H01S 5/32*           (2006.01)
    *H01S 5/40*           (2006.01)
             (Continued)

(52) U.S. Cl.
CPC ............... *H01S 5/32* (2013.01); *B82Y 20/00* (2013.01); *G01N 21/59* (2013.01); *H01S 5/12* (2013.01);
(Continued)

(58) Field of Classification Search
CPC ...... H01S 5/1071; H01S 5/125; H01S 5/3402; H01S 5/227–2275
See application file for complete search history.

(56) References Cited

U.S. PATENT DOCUMENTS

| | | | | |
|---|---|---|---|---|
| 5,115,284 A | * | 5/1992 | Kawasaki | .................. 372/45.01 |
| 5,179,040 A | * | 1/1993 | Hattori | .................... H01S 5/227 |
| | | | | 148/DIG. 95 |

(Continued)

FOREIGN PATENT DOCUMENTS

| | | |
|---|---|---|
| CN | 101847828 A | 9/2010 |
| EP | 1443527 A1 | 8/2004 |

(Continued)

OTHER PUBLICATIONS

Olindo, "Modulated Surface Textures for Enhanced Light Trapping in Thin-Film Silicon Solar Cells," Applied Physics Letters, AIP, American Institute of Physics, Melville, NY, US, vol. 97, No. 10, Sep. 8, 2010.

(Continued)

*Primary Examiner* — Xinning(Tom) Niu
*Assistant Examiner* — Sean P Hagan
(74) *Attorney, Agent, or Firm* — Myers Wolin, LLC

(57) ABSTRACT

Multi-surface emitting mid-IR multiwavelength distributed-feedback quantum cascade ring lasers laid out in a concentric circle are disclosed. The lasers utilize quantum cascade core designs to produce optical gain in the mid-infrared region and may generate several wavelengths simultaneously or sequentially. Methods of making along with methods of using such devices are also disclosed.

13 Claims, 5 Drawing Sheets

(51) Int. Cl.
*H01S 5/12* (2006.01)
*H01S 5/187* (2006.01)
*H01S 5/42* (2006.01)
*H01S 5/22* (2006.01)
*H01S 5/34* (2006.01)
*H01S 5/227* (2006.01)
*G01N 21/59* (2006.01)
*B82Y 20/00* (2011.01)

(52) U.S. Cl.
CPC ............ *H01S 5/187* (2013.01); *H01S 5/4087* (2013.01); *H01S 5/42* (2013.01); *H01S 5/227* (2013.01); *H01S 5/2224* (2013.01); *H01S 5/2275* (2013.01); *H01S 5/3402* (2013.01)

(56) References Cited

U.S. PATENT DOCUMENTS

| | | | | |
|---|---|---|---|---|
| 5,426,657 | A * | 6/1995 | Vakhshoori | ................ 372/45.01 |
| 5,561,683 | A | 10/1996 | Kwon | |
| 6,560,259 | B1 * | 5/2003 | Hwang | ................ 372/45.01 |
| 7,856,046 | B2 * | 12/2010 | Arimura | ................ 372/45.01 |
| 2006/0219996 | A1 * | 10/2006 | Yamamoto | ............. B82Y 20/00 257/12 |
| 2008/0049805 | A1 * | 2/2008 | Takiguchi | ............... B82Y 20/00 372/46.01 |
| 2009/0067460 | A1 * | 3/2009 | Murata | ................. B82Y 20/00 372/33 |
| 2011/0080931 | A1 | 4/2011 | Tredicucci et al. | |
| 2011/0188525 | A1 * | 8/2011 | Claudon | ................... H01S 1/02 372/34 |
| 2012/0033697 | A1 * | 2/2012 | Goyal et al. | ............... 372/45.01 |

FOREIGN PATENT DOCUMENTS

| | | | |
|---|---|---|---|
| EP | 2133924 | A1 | 12/2009 |
| JP | 2005216959 | A | 8/2005 |
| WO | 2010090142 | A1 | 8/2010 |

OTHER PUBLICATIONS

Wang, E., "Compact Quantum Cascade Laser Based Atmospheric CO2 Sensor," JMC5, CLEO '2011.

Brandstetter, M., "Tunable External Cavity Quantum Cascade Laser for the Simultaneous Determination of Glucose and Lactate in Aqueous Phase," The Royal Society of Chemistry, 2010.

Lee, B.G., "Wavelength Beam Combining of Quantum Cascade Laser Arrays for Remote Sensing," Proc. Of SPIE, vol. 7460, 746004-1 to 746004-9, 2009.

Zah, C., "Mid-IR Multiwavelength Concatenated Distributed-Feedback Laser with an Active Core Made of Cascaded Stages," U.S. Appl. No. 61/586,327, filed Jan. 13, 2012.

Mujagic, E., "Ring Cavity Induced Threshold Reduction in Single-Mode Surface Emitting Quantum Cascade Lasers," Applied Physics Letters, 96, 031111, 2010.

Mujagic, E., "Strategies Toward the Realization of Two-Dimensional Broadband and Coherent Quantum Cascade Ring Laser Arrays," Optical Engineering 49(11), 111113, Nov. 2010.

Bai, Y., "High Power, Continuous Wave, Quantum Cascade Ring Laser," Applied Physics Letters, 99, 251104, 2011.

Yao, Y., "Broadband Quantum Cascade Laser Gain Medium Based on a Continuum to Bound Active Region Design," Applied Physics Letters, 96, 211106, 2010.

Vurgaftman, I., "Mid-IR Type-11 Interband Cascade Lasers," IEEE Journal of Selected Topics in Quantum Electronics, 2011.

Caneau, C., "Quantum Cascade Laser Design with Stepped Well Active Region," U.S. Appl. No. 61/564,375, filed Nov. 29, 2011.

Chinese Notice of Second Office Action, dated Mar. 3, 2017, for corresponding China application No. 201380011255.1.

L. Djaloshinski et al.; "Coupling of concentric semiconductor microring lasers"; Optics Letters, vol. 23, No. 5; 364-366; Mar. 1, 1998.

Chinese Notice of First Office Action, dated Sep. 8, 2016, for corresponding China application No. 201380011255.1.

Chinese Notice on Grant of Patent Right and Proceeding with the Registration Formalities issued by SIPO (English translation), dated Jun. 2, 2017, for corresponding China application No. 201380011255.1.

European First Office Action, dated Oct. 2, 2017 issued by the European Patent Office for corresponding European patent application No. 13710655.5.

* cited by examiner

SURFACE EMITTING MULTIWAVELENGTH DISTRIBUTED-FEEDBACK CONCENTRIC RING LASERS

CROSS-REFERENCE TO RELATED APPLICATIONS

This application claims the benefit of priority under 35 U.S.C. § 119 of U.S. Provisional Application Ser. No. 61/604,170 filed on Feb. 28, 2012 the content of which is relied upon and incorporated herein by reference in its entirety.

FIELD

The present specification generally relates to semiconductor-based lasers and, more specifically, to distributed feedback lasers in the mid-infrared region that have an active core made of concentric rings to generate several wavelengths simultaneously or sequentially. Methods of making and using such devices are also disclosed.

TECHNICAL BACKGROUND

Distributed feedback ("DFB") lasers are a solid state diode laser technology that incorporates a diffraction grating into the active region of the laser. The DFB design allows for the emission of stable, single wavelengths that are slightly tunable via temperature change. DFB lasers are widely used in optical communication applications where the device's precise and stable wavelength is critical. However, the limited tunability of DFB lasers presents a number of problems and limits the overall usefulness of the devices in other fields. It would be advantageous in fields such as infrared countermeasures, gas sensing, communications, and other applications, if the strengths of DFB lasers could be expanded across a broader range of wavelengths.

SUMMARY

A first embodiment comprises a laser comprising a gain material comprising at least two, compositionally non-identical, layers forming a superlattice; and at least two circular lasing sections placed in a concentric circle with a common center, wherein the gratings have non-equivalent periods or Bragg wavelengths and wherein the laser sections are separated by an electrical isolation region. In some embodiments, the gain material generates photons by intersubband transitions. In some embodiments, the lasing sections are separated by an electric isolation region comprising a semi-insulating-type layer and by removal of the highly doped part of the n-cladding layer. In some embodiments, the emission wavelength from at least one of the laser sections is from about 2.5 μm to about 15 μm. In some embodiments, at least one layer of the superlattice comprises $Ga_xIn_{1-x}As$, where x is from 0 to 1. In some embodiments, at least one layer of the superlattice comprises $Al_yIn_{1-y}As$, where y is from 0 to 1. In other embodiments, the active region comprises at least one, two, or three active stacks. In some embodiments, the laser sections lase in pulsed mode. In some embodiments, the laser pulse duration is from about 10 ns to about 1 ms. In other embodiments, the laser sections lase in continuous mode. In some embodiments, all laser sections may fire simultaneously. In some embodiments, the laser sections are fired sequentially.

A second embodiment comprises a method of detecting the signal output from a sample, comprising applying at least one laser event from an embodiment to the sample; and collecting at least some of the light after it has interacted with the sample. In some embodiments the laser wavelength is in the mid-infrared region. In some embodiments, the collecting of the light provides information on mid-infrared absorbance of the sample. In some embodiments, the sample is in the solid, gas, or liquid phase. In some embodiments, the collecting of the light provides information on mid-infrared reflectance of the sample. In some embodiments, the sample is in the solid or liquid phase.

DETAILED DESCRIPTION

Figure 1:
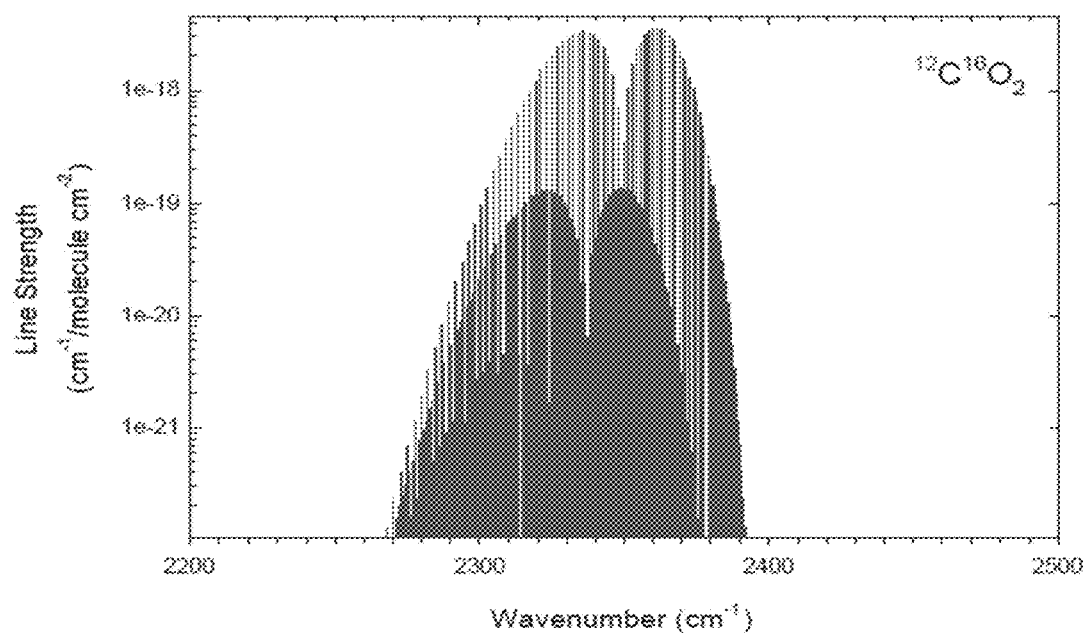
FIG. 1. Absorption spectrum of $CO_2$ near 2350 $cm^{-1}$.

The present invention can be understood more readily by reference to the following detailed description, drawings, examples, and claims, and their previous and following description. However, before the present compositions, articles, devices, and methods are disclosed and described, it is to be understood that this invention is not limited to the specific compositions, articles, devices, and methods disclosed unless otherwise specified, as such can, of course, vary. It is also to be understood that the terminology used herein is for the purpose of describing particular aspects only and is not intended to be limiting.

The following description of the invention is provided as an enabling teaching of the invention in its currently known embodiments. To this end, those skilled in the relevant art will recognize and appreciate that many changes can be made to the various aspects of the invention described herein, while still obtaining the beneficial results of the present invention. It will also be apparent that some of the desired benefits of the present invention can be obtained by selecting some of the features of the present invention without utilizing other features. Accordingly, those who work in the art will recognize that many modifications and adaptations to the present invention are possible and can even be desirable in certain circumstances and are a part of the present invention. Thus, the following description is provided as illustrative of the principles of the present invention and not in limitation thereof.

Disclosed are materials, compounds, compositions, and components that can be used for, can be used in conjunction with, can be used in preparation for, or are embodiments of the disclosed method and compositions. These and other materials are disclosed herein, and it is understood that when combinations, subsets, interactions, groups, etc. of these materials are disclosed that while specific reference of each various individual and collective combinations and permutation of these compounds may not be explicitly disclosed, each is specifically contemplated and described herein. Thus, if a class of substituents A, B, and C are disclosed as well as a class of substituents D, E, and F, and an example of a combination embodiment, A-D is disclosed, then each is individually and collectively contemplated. Thus, in this example, each of the combinations A-E, A-F, B-D, B-E, B-F, C-D, C-E, and C-F are specifically contemplated and should be considered disclosed from disclosure of A, B, and/or C; D, E, and/or F; and the example combination A-D. Likewise, any subset or combination of these is also specifically contemplated and disclosed. Thus, for example, the subgroup of A-E, B-F, and C-E are specifically contemplated and should be considered disclosed from disclosure of A, B, and/or C; D, E, and/or F; and the example combination A-D. This concept applies to all aspects of this disclosure including, but not limited to any components of the compositions and steps in methods of making and using the disclosed compositions. Thus, if there are a variety of additional steps that can be performed it is understood that each of these additional steps can be performed with any specific embodiment or combination of embodiments of the disclosed methods, and that each such combination is specifically contemplated and should be considered disclosed.

In this specification and in the claims which follow, reference will be made to a number of terms which shall be defined to have the following meanings:

"Include," "includes," or like terms means encompassing but not limited to, that is, inclusive and not exclusive.

The term "about" references all terms in the range unless otherwise stated. For example, about 1, 2, or 3 is equivalent to about 1, about 2, or about 3, and further comprises from about 1-3, from about 1-2, and from about 2-3. Specific and preferred values disclosed for compositions, components, ingredients, additives, and like aspects, and ranges thereof, are for illustration only; they do not exclude other defined values or other values within defined ranges. The compositions and methods of the disclosure include those having any value or any combination of the values, specific values, more specific values, and preferred values described herein.

The indefinite article "a" or "an" and its corresponding definite article "the" as used herein means at least one, or one or more, unless specified otherwise.

As used herein, a "superlattice" comprises at least two semiconductor materials with different bandgaps that produce quantum well confinement and intersubband transition (see, e.g., U.S. Appl. No. 61/564,375, herein incorporated by reference in its entirety). The thicknesses of the at least two semiconductor materials may change within lattice or may be of constant thickness. If the thicknesses of the materials change, they may change in a linear or nonlinear fashion.

As used herein, a "stage" comprises a series of quantum wells formed by the superlattice that allow electrons to transition from an injector region to an active section. As used herein, a "stack" comprises a series of stages. The "active region" or "core" is comprised of at least one stack and is used to describe the region of the laser that produces the light emission.

A first embodiment comprises a multi-surface emitting mid-IR multiwavelength distributed-feedback quantum cascade concentric ring laser ("DFB-QC-CRL")) to generate multiple wavelengths simultaneously or sequentially in time. In some embodiments, the DFB-QC-CRL lasers are in a concentric arrangement with a shared common center axis. In some embodiments, the lasing wavelength of each DFB-QC ring laser is determined by its own second order grating. In some embodiments, all the DFB-QC ring lasers emit light toward the same space in the same direction. For certain applications needing more wavelengths, the concentric ring lasers may be repeated in one or two dimensions within one chip and all the lasers can be designed to emit light toward the same spatial point.

In some embodiments, the DFB-CRL lases in the infrared ("IR") region. In some embodiments, the DFB-CRL lases in the region from about 2.5 µm to about 15 µm. Such a device is capable of sampling a broad absorption line of a single molecule or several absorption lines from different molecules. Methods of forming embodiments may comprise using a fabrication process similar to that used in distributed feedback ("DFB") quantum cascade lasers ("QCLs"). Embodiments herein are advantageous in that they can replace wavelength tunable external cavity ("EC") QCLs due to smaller sizes, faster speeds and lower costs. Further, embodiments also have size and cost advantages over a DFB QCL array because DFB QCL arrays need optical combining optics to combine the output of an array into one optical beam.

Figure 2:
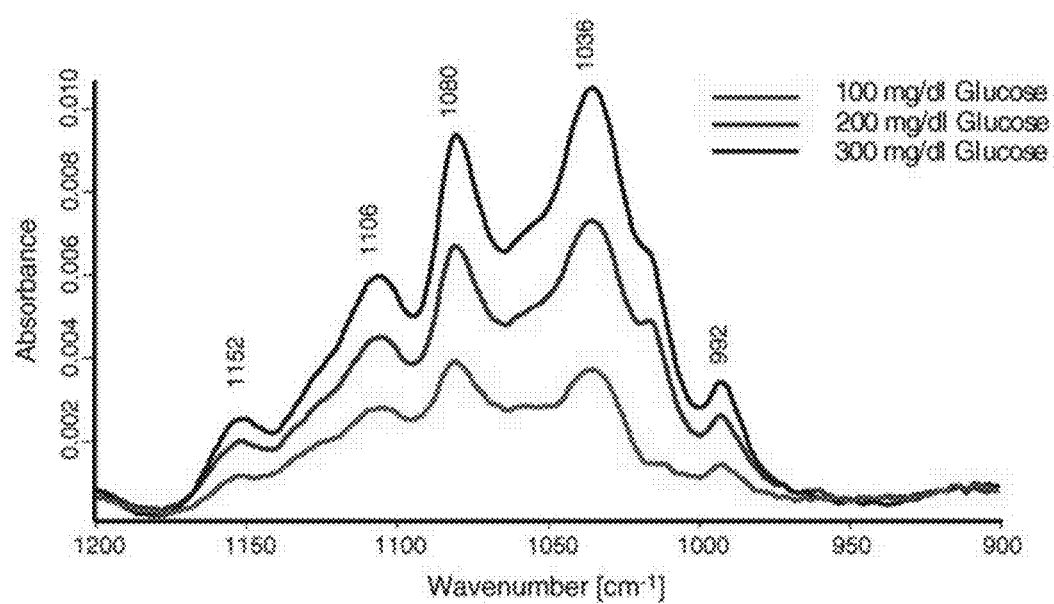
FIG. 2. Absorption spectrum of glucose at different concentrations.

One particular application where embodiments may be useful is in chemical analysis via infrared ("IR") spectroscopy. The strong absorption lines in the mid-IR region from the vibration of chemical bonds can be used to identify molecular composition. Mid-IR wavelength tunable sources like DFB QCLs may be used to scan the wavelength around an absorption line. While traditional DFB QCLs have a small wavelength tuning range of about 10 $cm^{-1}$ and are often used to detect one of narrow absorption lines, such as that of a small molecule (as an example, FIG. 1 shows the absorption lines of $CO_2$ near 2350 $cm^{-1}$, i.e. around 4.2-4.3 µm), embodiments of the present invention have much larger wavelength coverage and may be used to detect the broad absorption line of a large molecule (FIG. 2 shows the absorption at 950-1200 $cm^{-1}$ of glucose).

Figure 5:
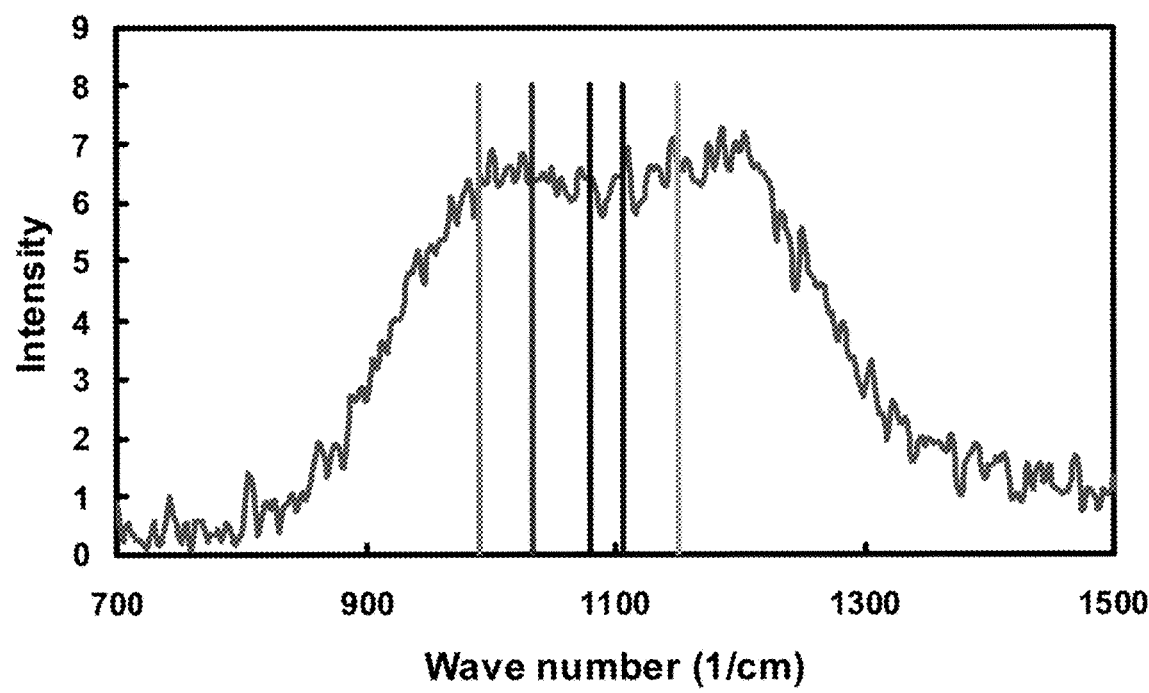
FIG. 5. Spontaneous emission spectrum from a stack of QC cores. The gain peak of each core is designed to be near one of the sampling wavelengths.

The core provides the optical gain needed to achieve lasing. The core of the laser may comprise a stack of quantum cascade ("QC") or interband cascade ("IC") regions. Any QC or IC structure with broad optical gain may be used. In some embodiments, the core comprises a QC structure. In some embodiments, the core comprises an IC structure. The gain peak of each core is designed to be near one of the sampling wavelengths, as shown in FIG. 5. The cores with optical gain at shorter wavelength normally should be placed closer to the center of the optical mode since the optical mode of shorter wavelength is narrower than that of longer wavelength.

Embodiments may comprise a gain material comprising at least two, compositionally non-identical, layers forming a superlattice. By proper design of the layer thicknesses, it is possible to engineer a population inversion between two subbands in the system which is necessary to achieve laser emission. The thickness of the layers may be identical or may be different depending on the desired design. In some embodiments, the layers have a thickness from about 1 Å to about 500 ÅA. In some embodiments, the layers have a thickness from about 10 Å to about 100 Å. In some embodiments, the layers have a thickness of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 35, 40, 45, 50, 55, 60, 70, 80, 90, 100, 125, 150, 175, 200, 250, 300, 350, 400, 450, or 500 Å.

Materials that may be used to form the layers in the gain material generally comprise semiconductors, such as group IV, III-V, and II-VI semiconductors. In some embodiments, the layers may comprise GaAs, $Al_xGa_{1-x}As$, $Si_xGe_{1-x}$, or $Ga_xIn_{1-x}As$ and $Al_yIn_{1-y}As$, GaSb, InAs, AlSb, $Ga_xIn_{1-x}Sb$, wherein x and y are from 0 to 1.

The superlattice gain material may be produced using various techniques, for example molecular-beam epitaxy (MBE) (including gas-source MBE and MO-MBE), metalorganic vapor phase epitaxy (MOVPE), or sputtering. These methods allow production of layers with thicknesses of only a few atomic spacings.

Embodiments may further comprise an optical waveguide. An optical waveguide, as used herein, comprises a physical structure that guides electromagnetic waves in the optical spectrum. While not limited to any specific type of waveguide, one type of optical waveguide commonly used is a ridge waveguide. A ridge waveguide is created by etching parallel trenches in the quantum cascade gain material to create an isolated ring of QC material, typically, but not necessarily, about 10 μm wide and several mm long—in the case of a ring laser, the waveguide comprises a circle or circular structure. Lateral mode confinement may be achieved by the deposition in the trenches of a dielectric material, and then the entire ridge is typically coated with gold to provide electrical contact and to help remove heat from the ridge when it is producing light. More commonly, lateral mode confinement is achieved by growing in the trenches a semi-insulating material such as InP if the laser was grown on InP substrate. Light is emitted from either the top or bottom surface.

Figure 3A:
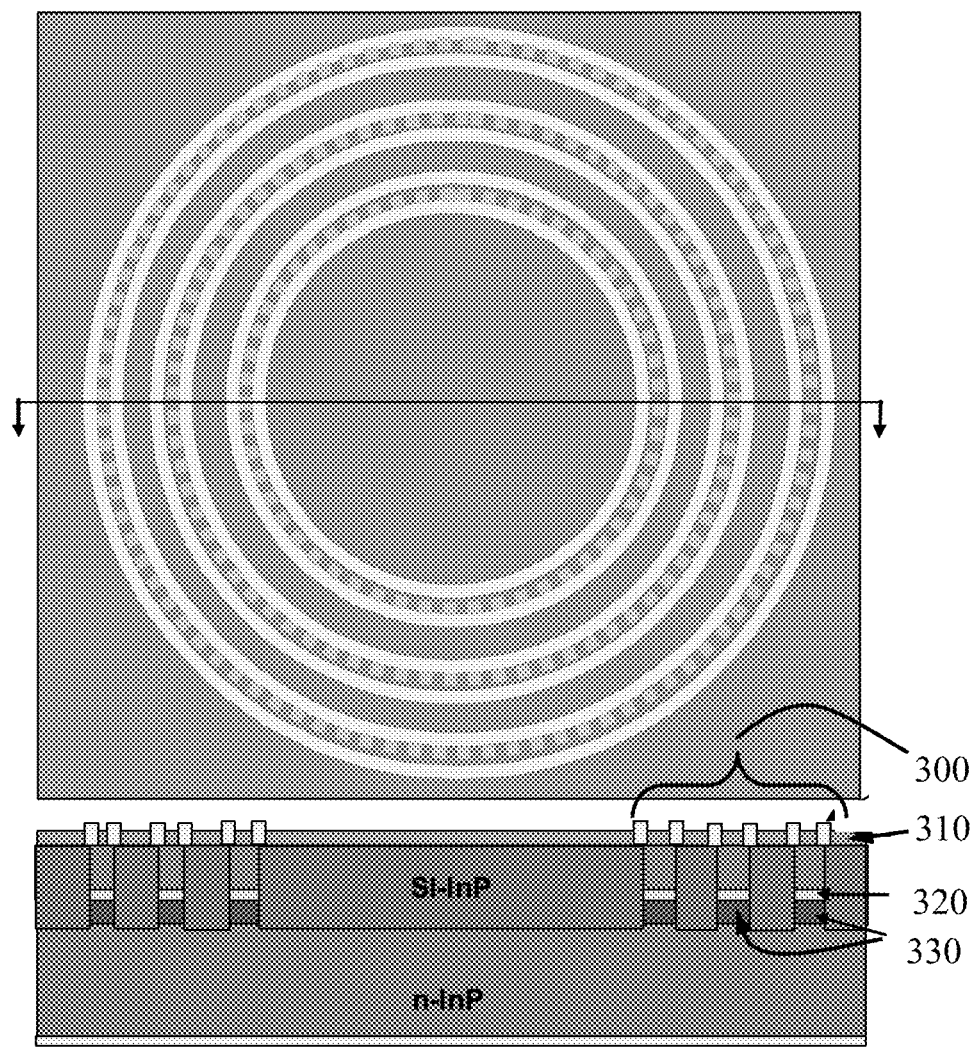
FIG. 3A describes a top surface emitting mid-IR three-wavelength distributed-feedback (DFB) quantum cascade (QC) concentric ring laser from the top and in cross section. The metal contacts (300) of each ring laser are connected to a bonding pad which is not shown. The light and current (carriers) (330) are confined by the semi-insulating (SI) InP current blocking layer. An alternate way for confinement may be provided by raised ridges.
Figure 3B:
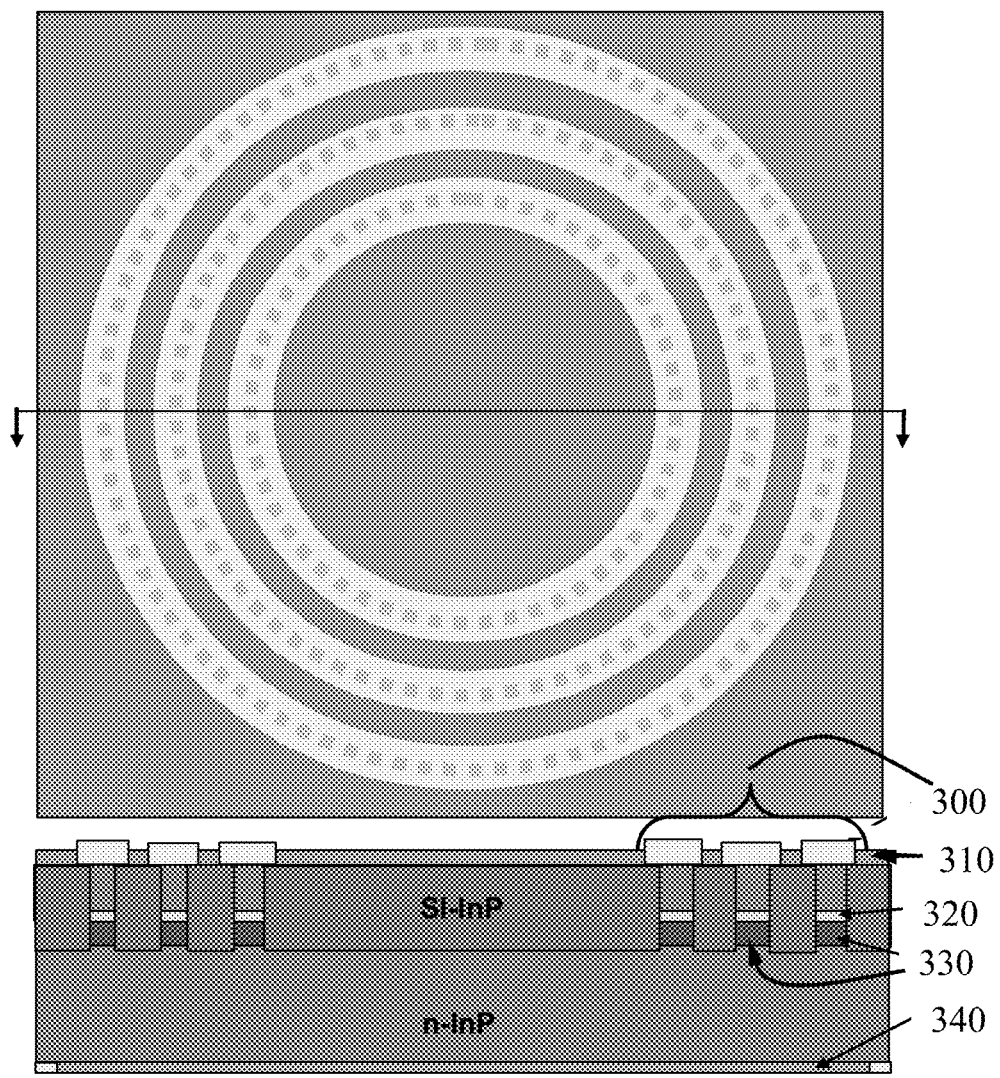
FIG. 3B describes a bottom surface emitting DFB QC concentric ring laser. As in FIG. 3A, the metal contacts (300) of each ring laser are connected to a bonding pad which is not shown and the light and current (carriers) are confined by the semi-insulating (SI) InP current blocking layer. An alternate way for confinement may be provided by raised ridges FIG. 4. Reflection spectrum of five gratings with five different periods selected to match five absorption peaks of glucose shown in FIG. 2.

Embodiments may further comprise an antireflection or antireflective (AR) layer 310 and 340 as shown in FIGS. 3A and 3B. As used herein an AR layer comprises an optical coating applied to at least one face of the device and that reduces reflection, particularly in the IR region. The AR layers may be of any type, such as index-matching, single layer interference, multi-layer interference, or moth eye (nanostructured). In some embodiments, the AR coatings provide less than about 10%, 5%, 4%, 3%, 2%, 1%, 0.5%, 0.1%, 0.01%, 0.001%, or 0% loss.

Embodiments further comprise at least two laser sections placed in a concentric circle with a common center point, each laser section comprising a grating, wherein the gratings have non-equivalent periods or Bragg wavelengths. A grating, 320 in FIGS. 3A and 3B, as used herein, comprises a structure formed from multiple layers of alternating materials with varying refractive index, or by periodic variation of some characteristic (such as height), resulting in periodic variation in the effective refractive index in the guide. Each layer boundary causes a partial reflection of an optical wave. For waves whose wavelength is close to the multiplication of the period and the effective refractive index, the many reflections combine with constructive interference, and the grating acts as a high-quality reflector reflecting the light partly in the plane to achieve lasing and partly out of plane as surface emitting output.

Figure 6:
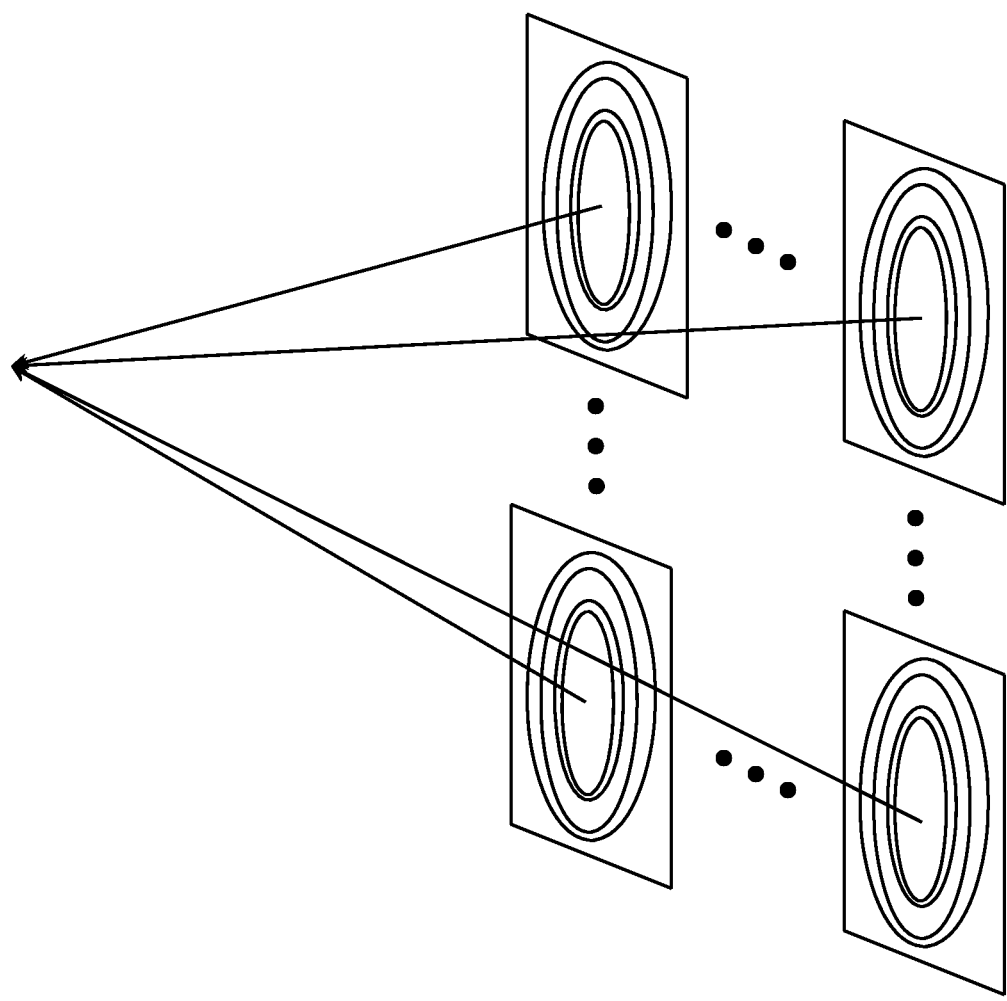
FIG. 6 illustrates a device including multiple lasers in accordance with an embodiment of the invention.

As shown in FIG. 6, another embodiment comprises multiple concentric ring lasers repeated in one or two dimensions on a single chip. In some embodiments, the lasers are designed to emit light toward the same spatial spot.

Figure 4:
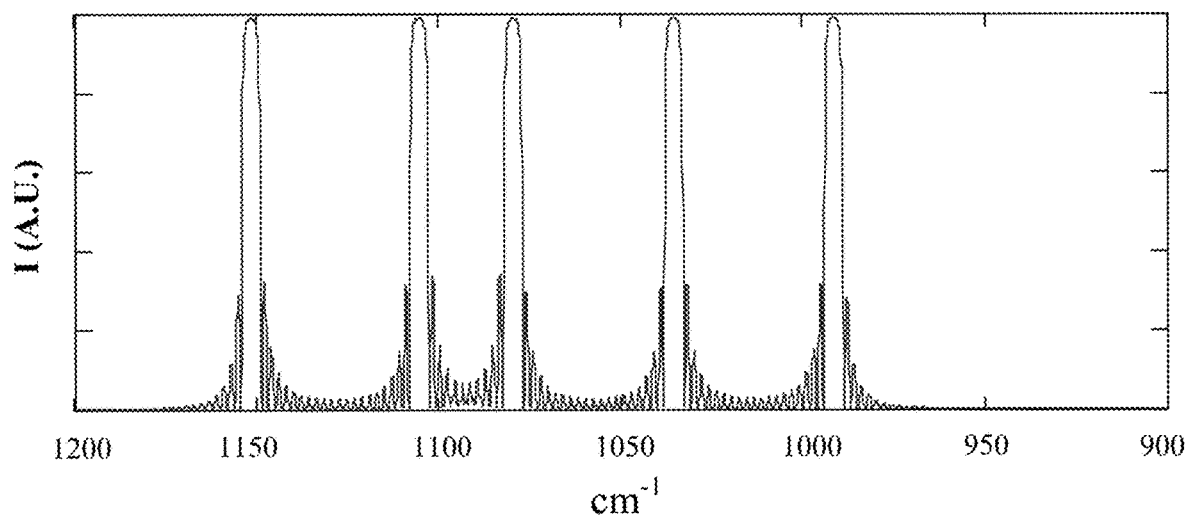

Gratings with multiple periods can be patterned by electron beam ("e-beam") writing or contact printing of a grating mask manufactured by e-beam lithography. FIG. 4 shows the five reflection peaks of five gratings with five different periods selected to match five absorption peaks of glucose shown in FIG. 2.

Additional components that may be found in embodiments comprise n-type cladding layers both above and/or below the gain material. The active gain and wavelength selective sections may be capped with a patterned electrical contact layer which comprises respective control electrodes dedicated to the different laser sections. An insulating dielectric material may be deposited in appropriate regions in the patterned electrical contact layer to isolate electrically the distinct regions of the laser structure.

In some embodiments, an active waveguide core may be sandwiched between upper and lower n-type cladding layers. The upper and lower n-type cladding layers may comprise InP, GaAs, AlGaAs, InAs, AlSb, or any other conventional or yet-to-be developed cladding material suitable. For example, and not by way of limitation, it is contemplated that a variety of cladding materials might be suitable, including II-VI semiconductors, Si—Ge or GaN-based materials, etc.

Additional components may comprise insulator layers and metal contact layers (see, e.g., FIGS. 3A and 3B).

There are diverse ways of realizing the isolation regions. Among these are selective growth of iron-doped InP, ion implantation, and diffusion of a p-type dopant. If the last option is chosen, the respective compositions of the upper and lower n-type cladding layers and the gain material may be selected to facilitate formation of the p-type electrical isolation regions by dopant diffusion. More specifically, the upper and lower n-type cladding layers may comprise InP and the p-type dopant may be selected such that its maximum stable concentration in the InP upper n-type cladding layer is below approximately $n \times 10^{18}$ cm$^{-3}$, where n is less than 3.

An alternative method of isolating the lasing sections comprises removal of the highly doped part of the n-cladding layer.

By way of example, and not limitation, it is alternatively contemplated that the upper and lower n-type cladding layers may be GaAs-based cladding layers. Some of the cladding layers may be AlGaAs or (Al)GaInP instead of simply GaAs or InP. For GaAs-based cladding layers, the core may be GaAs/AlGaAs, AlGaAs/AlGaAs, (Al)GaInP/(Al)GaInP, or GaInAs/(Al)GaAs. Additional layers of similar composition are contemplated for the remaining layers of the structure and should be selected to compensate for any lattice-mismatch between GaInAs and the GaAs substrate. For example, and not by way of limitation, other possible layers are GaInP, AlGaInP, GaAsP, and GaInAsP. For GaAs-based cladding layers, suitable dopants used to make (Al)GaAs semi-insulating include, but are not limited to Cr and O. At very low temperature growth, semi-insulating (Al)GaAs can be obtained without any dopant.

Embodiments herein may be used in either a pulsed or continuous-wave mode. Laser pulse duration may be from about 1 ns to about 1 ms. In some embodiments, the pulse width at FWHM is about 1 ns, 2 ns, 3 ns, 4 ns, 5 ns, 6 ns, 7 ns, 8 ns, 9 ns, 10 ns, 20 ns, 50 ns, 60 ns, 70 ns, 80 ns, 90 ns, 100 ns, 200 ns, 300 ns, 400 ns, 500 ns, 600 ns, 700 ns, 800 ns, 900 ns, 1 μs, 10 μs, 100 μs, or 1 ms. In some embodiments, devices embodied herein may be designed to fire all laser sections simultaneously, individually, and/or in a sequential or programmed order.

As embodiments herein incorporate aspects of an external cavity quantum cascade laser, the breadth of laser wavelengths that may be output from the devices is significantly greater than what one would expect from a DFB laser. DFB QCLs generally have a small tunability of around 10 cm$^{-1}$.

The peak wavelength of the laser sections may be selected to be the sampling wavelengths ($\lambda_{si}$, I=1 to n) of a broad absorption line of one molecule or several absorption lines from different molecules. In some embodiments, the DFB CRL lases in the region from about 2.5 µm to about 15 µm. In some embodiments, the DFB CRL lases at about 2.5, 2.6, 2.7, 2.8, 2.9, 3.0, 3.1, 3.2, 3.3, 3.4, 3.5, 3.6, 3.7, 3.8, 3.9, 4.0, 4.1, 4.2, 4.3, 4.4, 4.5, 4.6, 4.7, 4.8, 4.9, 5.0, 5.1, 5.2, 5.3, 5.4, 5.5, 5.6, 5.7, 5.8, 5.9, 6.0, 6.5, 7.0, 7.5, 8.0, 8.5, 9.0, 9.5, 10.0, 10.5, 11.0, 11.5, 12.0, 12.5, 13.0, 13.5, 14.0, 14.5, or 15.0 µm.

Embodiments may be used in any number of methods wherein IR radiation, and particular IR laser radiation would be advantageous. Particular applications include IR absorbance or reflectance measurements, IR and FTIR spectroscopies, Raman spectroscopy, gas and/or chemical weapons detection, chemical dynamics and kinetics measurements, thermal experiments, etc. In one embodiment, the embodiments are used in IR absorbance measurements to identify molecular compositions.

We claim:

1. A laser comprising:
   i) a gain material comprising at least two, compositionally non-identical, layers forming a superlattice, wherein the gain material generates photons by intersubband transitions;
   ii) at least two circular lasing sections with non-equivalent lengths placed in a concentric circle with a common center, the surface of the circular lasing sections being parallel to the layers forming the superlattice, wherein:
      a. each lasing section comprises
         i. a grating;
         ii. an active region; and
         iii. an electrical contact for injecting current into the gain material in a direction perpendicular to the surface of the circular lasing sections;
      b. the lasing sections are separated by an electrical isolation region; and
      c. the gratings in the at least two circular lasing sections have non-equivalent periods or Bragg wavelengths, and are configured to act as reflectors reflecting the photons partly within the surface to achieve lasing and partly out of the surface as surface emitting output,
   wherein the lasing sections are arranged such that the section emitting at the shortest wavelength, which is defined by the grating with the smallest grating period, is closest to the common center, and the section emitting at the longest wavelength, which is defined by the grating with the largest grating period, is farthest from the common center.

2. The laser of claim 1, wherein the emission wavelength from at least one of the laser sections is from about 2.5 µm to about 15 µm.

3. The laser of claim 1, wherein at least one layer of the superlattice comprises $Ga_xIn_{1-x}As$, where x is from 0 to 1.

4. The laser of claim 1, wherein at least one layer of the superlattice comprises $Al_yIn_{1-y}As$, where y is from 0 to 1.

5. The laser according of claim 1, wherein the active region comprises at least three stacks and wherein the lasing sections are arranged such that the stack emitting at the shortest wavelength is closest to the center of the active region, and the stack emitting at the longest wavelength is farthest from the center of the active region.

6. The laser of claim 1, wherein the laser sections lase in pulsed mode.

7. The laser of claim 6, wherein the laser pulse width is from about 10 ns to about 1 ms.

8. The laser of claim 1, wherein the laser sections lase in continuous mode.

9. The laser of claim 1, wherein all laser sections may fire simultaneously.

10. The laser of claim 1, wherein the laser sections are fired sequentially.

11. A device comprising multiple lasers that are designed to emit light toward the same spatial spot, wherein each of the lasers comprises:
   i) a gain material comprising at least two, compositionally non-identical, layers forming a superlattice, wherein the gain material generates photons by intersubband transitions; and
   ii) at least two circular lasing sections with non-equivalent lengths placed in a concentric circle with a common center, the surface of the circular lasing sections being parallel to the layers forming the superlattice, wherein:
      a. each lasing section comprises
         i. a grating;
         ii. an active region; and
         iii. an electrical contact for injecting current into the gain material in a direction perpendicular to the surface of the circular lasing sections;
      b. the lasing sections are separated by an electrical isolation region; and
      c. the gratings in the at least two circular lasing sections have non-equivalent periods or Bragg wavelengths, and are configured to act as reflectors reflecting the photons partly within the surface to achieve lasing and partly out of the surface as surface emitting output,
   wherein the lasing sections are arranged such that the section emitting at the shortest wavelength, which is defined by the grating with the smallest grating period, is closest to the common center, and the section emitting at the longest wavelength, which is defined by the grating with the largest grating period, is farthest from the common center.

12. The laser of claim 1, wherein the lasing sections are separated by an electric isolation region comprising a p-type dopant with maximum stable concentration in an InP upper n-type cladding layer below approximately $n \times 10^{18}$ cm$^{-3}$, where n is less than 3.

13. The laser of claim 11, wherein the lasing sections are separated by an electric isolation region comprising a p-type dopant with maximum stable concentration in an InP upper n-type cladding layer below approximately $n \times 10^{18}$ cm$^{-3}$, where n is less than 3.

* * * * *